United States Patent
Kumar (10) Patent No.: US 9,245,622 B1
(45) Date of Patent: Jan. 26, 2016

(54) PRE-CONDITIONING TWO-TERMINAL MEMORY FOR INCREASED ENDURANCE

(71) Applicant: Crossbar, Inc., Santa Clara, CA (US)

(72) Inventor: Tanmay Kumar, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 119 days.

(21) Appl. No.: 14/214,256

(22) Filed: Mar. 14, 2014

Related U.S. Application Data (60) Provisional application No. 61/799,164, filed on Mar. 15, 2013.

(51) Int. Cl.
*G11C 13/00* (2006.01)
*G11C 11/56* (2006.01)

(52) U.S. Cl.
CPC ........ *G11C 13/0069* (2013.01); *G11C 11/5678* (2013.01); *G11C 13/0004* (2013.01); *G11C 2013/0083* (2013.01)

(58) Field of Classification Search
CPC ........... G11C 13/0004; G11C 13/0069; G11C 11/5678
USPC .......................................... 365/163, 148, 113
See application file for complete search history.

(56) References Cited

U.S. PATENT DOCUMENTS

2010/0182826 A1*  7/2010  Czubatyj ................. G11C 7/04
                                                        365/148

\* cited by examiner

*Primary Examiner* — Jason Lappas
(74) *Attorney, Agent, or Firm* — Amin, Turocy & Watson, LLP (57) ABSTRACT

Providing for preconditioning of multi-programmable, two-terminal memory for improved endurance and switching functionality is described herein. By way of example, one or more pre-conditioning signals can be applied to a memory cell post-fabrication. The preconditioning signal(s) can have relatively small power, avoiding programming of the memory cell, compared with an associated program signal. The pre-conditioning signal(s) can facilitate reliable erasure of the memory cell following subsequent programming at normal programming power. Accordingly, switching functionality of the two-terminal memory can be preserved, maintaining the multi-programmable nature of the memory cell.

20 Claims, 9 Drawing Sheets

100 ⟶

| ELECTRODE 102 | {e.g., Ag, Ti/Ag, Ti/Ag/ W, Ti/Ag, TiN, W, etc.} |
| SWITCHING MATERIAL 104 | {e.g., a-Si, amorphized Si, Si sub-oxide, etc.} |
| CONTACT MATERIAL 106 | {e.g., p+ poly, p-type SiGe, multilayer doped SiGe, etc.} |
| SUBSTRATE 108 | {e.g., Si, Si compound, etc.} |

PRE-CONDITIONING TWO-TERMINAL MEMORY FOR INCREASED ENDURANCE

CROSS-REFERENCE TO RELATED APPLICATION

The present application for patent claims the benefit of U.S. Provisional Patent Application Ser. No. 61/799,164, entitled "INCREASE ENDURANCE IN a-Si RRAM WITH PRE-CONDITIONING" and filed Mar. 15, 2013; assigned to the assignee hereof and expressly incorporated by reference herein in its entirety and for all purposes.

TECHNICAL FIELD

This disclosure relates generally to electronic memory; for example, the disclosure describes the pre-conditioning of two-terminal memory to improve endurance and switching functionality of a two-terminal memory cell.

BACKGROUND

Success of semiconductor electronics has largely resulted from a great personal and commercial utility derived from high-speed electronic communications. Provision of these electronic communications, particularly on a global scale, involves the convergence of several factors: development of communication infrastructure to transport data, design of components and devices to initiate or facilitate communication and various applications thereof, and manufacturing techniques to fabricate these components. Massive demand for the utility of electronic communication has engendered an industry related to each of the factors. Infrastructure developers provide global networks to transport data and interpersonal communications, software developers provide applications, operating systems, and computing devices to access, manage and utilize the communications, component designers develop electronic components—processors, memory, etc.—to process and store the data, and fabrication facilities create the electronic components.

One reason for the persistent success of electronics is the variety and diversity of useful applications that develop from increases in speed and capacity of electronic components. In turn, the speed and capacity of such components is associated with an intensive transistor down-scaling process, in which smaller transistors have lead to increased storage capacity, and in some cases increased processing power. In recent years, components such as field effect transistors used for switches, memory cells, and other components of electronic devices have achieved sizes on the order of 100 nm. Even smaller such devices are theorized. The inventors of the present disclosure, however, believe that significant challenges will occur for sub-100 nm transistor components, including short channel effects, performance degradation, longevity problems, and so on.

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for preconditioning of two-terminal memory to improve endurance of memory cells, and facilitate reliable switching performance in two-terminal memory cells. In various embodiments, one or more pre-conditioning signals can be applied to a memory cell, in advance of a programming event. The preconditioning signal(s) can have a relatively small magnitude, facilitating the reliable switching performance. In this context, small magnitude can be relative to a program signal for providing a target current response for a program state of the memory cell. In some embodiments, the small magnitude signal can relate to a small voltage, small field, small current, small pulse width, or the like, or a suitable combination thereof, relative to associated characteristics of a program signal. In further aspects, the pre-conditioning signals can be applied to the two-terminal memory cell in an as-formed configuration.

In one or more embodiments, pre-conditioning can comprise applying a plurality of successively larger magnitude pre-conditioning signals to a two-terminal memory cell. As an example, a first pre-conditioning signal applied to a memory cell in an as-formed configuration can have a first magnitude. A second pre-conditioning signal can be applied to the memory cell following the first pre-conditioning signal, and having a magnitude larger than the first pre-conditioning signal. In an embodiment, zero or more additional pre-conditioning signals can be applied to the memory cell following the second pre-conditioning signal. Further, an erase pulse can subsequently applied to the memory cell, and prepare the memory cell for further program or erase/switching operation.

In still other embodiments, pre-conditioning can comprise applying a plurality of successively larger magnitude pre-conditioning signals, interspersed with an opposite polarity signal. For instance, a first pre-conditioning signal of a first magnitude can be applied to a memory cell in an as-formed state, followed by an opposite polarity signal. A second pre-conditioning signal of a second magnitude can be applied to the memory cell followed by a second opposite polarity signal. Zero or more additional sequences of pre-conditioning signals followed by opposite polarity signals can be performed in these embodiments, thereby preparing the memory cell for operational program/erase functionality.

In further embodiments, the subject disclosure provides a method. The method can comprise applying a first program signal to a first electrode of a two-terminal memory cell, the first program signal having a first current limit and applying a second program signal to the first electrode of the two-terminal memory cell, the second program signal having a second current limit. Moreover, the method can comprise applying a third signal to the first electrode of the two-terminal memory cell, the third signal having a polarity opposite to the first program signal or the second program signal. Furthermore, the second current limit can be larger in magnitude than the first current limit, and the first current limit can have a magnitude lower than a minimum program current associated with switching the two-terminal memory cell to a program state.

In an additional embodiment, the disclosure can provide a method of preconditioning a resistive switching memory cell in advance of utilization of the resistive switching memory cell in a memory operation. The method can comprise applying a first voltage across a resistive switching memory cell, the first voltage selected to cause the resistive switching memory cell to have a current response lower than a program state current response. In addition, the method can comprise applying a second voltage across the resistive switching memory cell, the second voltage selected to cause the resistive switching memory cell to have a second current response greater than the current response. Moreover, the method can comprise applying an erase voltage to the resistive switching memory cell.

In still other embodiments the subject disclosure provides an electronic device. The electronic device can comprise a memory comprising a substrate having a complementary semiconductor metal oxide device and a two-terminal memory cell, both formed on or above the substrate, wherein the memory is configured to store instructions related to operating the electronic device. The electronic device can additionally comprise a memory controller configured to operate the memory and a processor communicatively connected to the memory and configured to execute the instructions to facilitate operations of the electronic device. Moreover, the two-terminal memory cell can be preconditioned, wherein the pre-conditioning can comprise: applying a first signal having a first current compliance to the two-terminal memory cell and applying a second signal to the two-terminal memory cell having a second current compliance to the two-terminal memory cell, the second current compliance having higher magnitude than the first current compliance.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer capable of being ionized. Under suitable conditions, the active metal layer can provide filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Other examples of materials suitable for the RSL could include $Si_XGe_YO_Z$ (where X, Y and Z are respective suitable positive integers), a silicon oxide (e.g., $SiO_N$, where N is a suitable positive integer), amorphous Si (a-Si), amorphous SiGe (a-SiGe), TaO$_B$ (where B is a suitable positive integer), HfO$_C$ (where C is a suitable positive integer), TiO$_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and in U.S. Pat. No. 8,198,144 issued Jun. 12, 2012 and assigned to the assignee of the present application for patent, each of which are incorporated by reference herein in their respective entireties and for all purposes.

To program a filamentary-based resistive switching memory cell, a suitable program voltage can be applied across the memory cell causing a conductive path or a filament to form through a relatively high resistive portion of the memory cell. This causes the memory cell to switch from a relatively high resistive state, to a relatively low resistive state. According to the inventors of the present disclosure, in some resistive-switching devices, an erase process can be implemented to deform the conductive filament, at least in part, causing the memory cell to return to the high resistive state from the low resistive state. According to the inventors, in some memory cells the capacity to transition between states can be hampered or lost entirely. This can be based, according to the inventors, on components used for a particular memory cell, on characteristics of electric signals used for early or initial programming, or other factors. As one example, the inventors believe that an issue can arise following an initial programming event of a memory cell utilizing a voltage sweep with a relatively high current limit (e.g., between about 50 microAmps (uA) and about 80 uA). The inventors believe that, while this memory cell can become programmed as expected, difficulty can arise when trying to erase the programmed cell in some circumstances. According to the inventors, applying a negative voltage to erase the memory cell can instead further program the memory cell, making it more conductive. The inventors refer to this phenomenon—where application of a negative voltage to a bipolar memory cell following a programming event of that bipolar memory cell causes a further programming of the cell (e.g., further injection of ions into a switching medium or further reduction of resistance of the switching medium)—as "reverse pop".

When a memory cell loses capacity to be erased, the memory cell is no longer a switch-able device. Such a memory cell effectively becomes a one-time programmable memory (e.g., a read-only memory cell). For a memory cell intended to be switch-able, or multi-programmable, loss of the capacity to erase the memory cell effectively renders the memory cell inoperable.

Various embodiments of the present disclosure facilitate improved endurance and reliable switching function of a two-terminal memory cell. For instance, some embodiments disclose pre-conditioning for two-terminal memory, mitigating or avoiding the occurrence of reverse pop, as described above. Furthermore, in at least some embodiments the pre-conditioning can facilitate cell switching with lower currents, potentially reducing power consumption or joule heating of a two-terminal memory cell.

Figure 1:
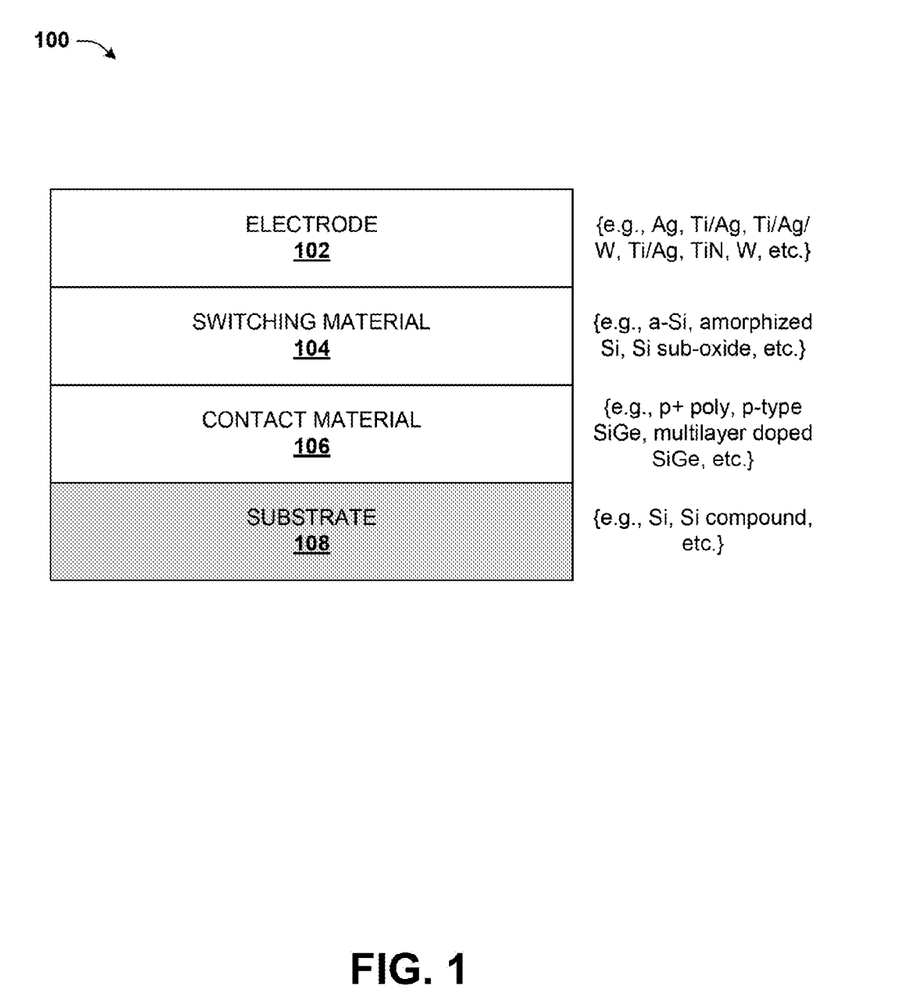
FIG. 1 illustrates a block diagram of an example monolithic stack for a two-terminal memory cell in various embodiments of the subject disclosure.

FIG. 1 illustrates a block diagram of an example memory cell 100 according to one or more embodiments of the subject disclosure. Memory cell 100 can be a two-terminal memory cell, in various embodiments. Moreover, memory cell 100 can be a resistive-switching memory cell in further embodiments. According to other embodiments, memory cell 100 can be configured for pre-conditioning, as described herein, resulting in improved endurance, reliable switching performance and reduced switching current, as some examples.

Memory cell 100 can comprise an electrode 102. Electrode 102 can be a conductive material that, in response to a field applied to memory cell 100, produces ions. In some embodiments, these ions can be produced at a boundary of electrode 102 and an adjacent material of memory cell 100, such as switching material 104. Furthermore, in one or more embodiments, electrode 102 can be an elemental metal that is not an ionically bonded material. Example conductive materials that can be employed for electrode 102 can include, among others: Ag, Au, Ti, TiN or other suitable compounds of titanium, Ni, Cu, Al, Cr, Ta, Fe, Mn, W, V, Co, Pt, Pd, or the like, or a suitable combination thereof. In further embodiments, electrode 102 can include additional layers (some very thin, e.g., 2 to 3 nm) such as Ti, TiN, W, or the like, above electrode 102 (e.g., between electrode 102 and a metal wire, such as a bitline, wordline, etc., of a memory array) or between top electrode 102 and an adjacent layer of memory cell 100 (e.g., switching layer 104), as a barrier layer(s), or the like.

Memory cell 100 can further comprise a switching layer 104. Switching layer 104 can be formed of an electrically resistive material (e.g., compared to an electrical resistivity of electrode 102). In addition to the foregoing, switching layer 104 can be at least in part permeable to ions produced at electrode 102 (or at an interface of electrode 102 and switching layer 104). In response to an electric field applied to memory cell 100, ions can migrate into switching layer 104. Penetration of ions through switching layer 104 toward contact material 106 or substrate 108, can reduce electrical resistance of switching layer 104, and furthermore can persist following termination of the electric field. The persistence of ion migration can facilitate non-volatile memory functionality, for instance. Switching material 104 can comprise an undoped amorphous silicon, amorphized silicon, a non-stoichiometric silicon oxide (e.g. silicon sub-oxide, SiO$_x$, where x is a number greater than 0 and not equal to (typically less than) two, a silicon oxide, a metallic oxide, Si$_x$Ge$_y$O$_z$, amorphous SiGe (a-SiGe), TaO$_x$, HfO$_x$, TiO$_x$ (respective variables representing suitable values or ranges of values for atomic elements of the associated compounds), and so forth, or a suitable combination thereof.

In addition to the foregoing, memory cell 100 can comprise contact material 106 formed adjacent to (e.g., above) a substrate 108. Contact material 106 can comprise a doped silicon material, such as a p+ polysilicon, a p-type SiGe, a multilayer doped SiGe, or the like. Substrate 108 can comprise a silicon material, a silicon compound, or other suitable substrate. In one or more embodiments, substrate 108 can be a complementary metal oxide semiconductor (CMOS) substrate, comprising one or more CMOS devices formed therein.

Figure 2:
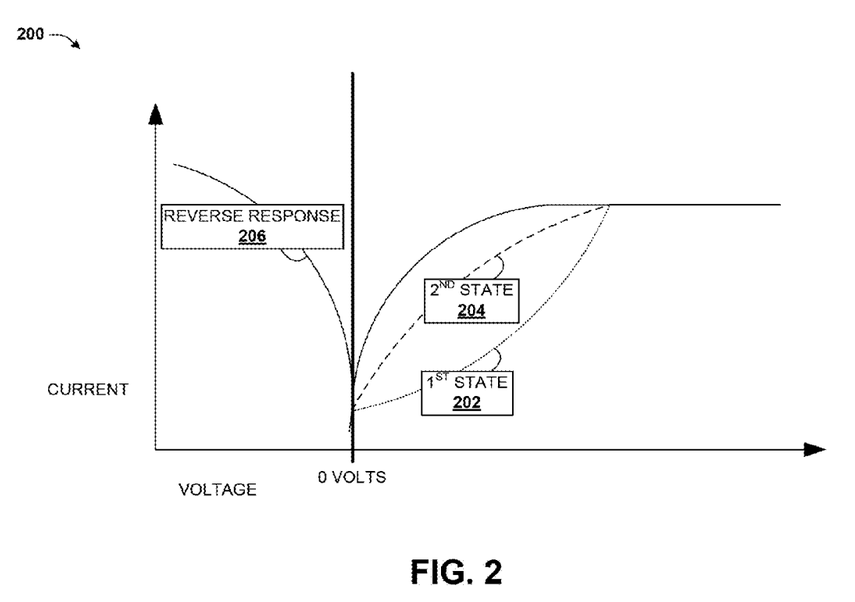
FIG. 2 depicts a diagram of a current voltage relationship for a two-terminal memory cell, in various embodiments.

FIG. 2 illustrates a diagram of an example chart 200 of current-voltage relationships for a two-terminal memory cell according to additional embodiments of the subject disclosure. In some embodiments, the two-terminal memory cell can be memory cell 100, of FIG. 1, supra. However, the subject disclosure is not limited to this embodiment, and can be applicable for other two-terminal memory cells (e.g., bipolar memory cells).

Chart 200 illustrates a $1^{st}$ state 202 having a first current response to an increasing positive voltage, illustrated by the dotted line. $1^{st}$ state 202 depicts a relatively gradual or slow increase in current as a function of increasing positive voltage. This relatively slow increase in current as a function of increasing voltage can correspond to a high resistance state of the two-terminal memory cell, for instance.

In response to a programming event, the two-terminal memory cell can have a $2^{nd}$ state 204 with a relatively faster increase in current as a function of increasing voltage. The $2^{nd}$ state 204 can correspond with a relatively low resistance state for the two-terminal memory cell. Together, $1^{st}$ state 202 and $2^{nd}$ state 204 can be associated with respective 0 and 1 states of a binary bit, effectively serving as a digital bit of information storage. Where the two-terminal memory cell can be switched between $1^{st}$ state 202 and $2^{nd}$ state 204, for instance via program and erase operations, the two-terminal memory cell can serve as a multi-programmable cell. In this capacity the two-terminal memory cell can be programmed to a 1 state (e.g., $2^{nd}$ state 204) or erased to a 0 state (e.g., $1^{st}$ state 202) upon application of a suitable program signal or erase signal to the two-terminal memory cell, respectively.

The inventors of the present disclosure have identified a potential problem with multi-programmability of two-terminal memory cells, such as memory cell 100. In some cases, upon applying a program signal to the memory cell and changing the memory cell from $1^{st}$ state 202 to $2^{nd}$ state 204, an erase signal of opposite polarity subsequently applied to the memory cell can cause an increase in current without returning to $1^{st}$ state 202. This is illustrated by reverse response 206, in which current simply increases in response to increasing negative voltage. Reverse response 206 represents a memory cell that can no longer be erased, and is effectively no longer a multi-programmable cell. The reverse response 206 can occur, according to the inventors, when an initial forming event (e.g., an initial programming signal) applied to the memory cell applies too much electrical power to the memory cell. In the case of resistive-switching memory, it is theorized that conductive ions penetrate a switching layer (e.g., switching layer 104) of the memory cell to such a degree that a reverse polarity erase bias can no longer deform a conductive filament of the ions within the switching layer. As one example, the inventors believe that a memory cell 100 comprising a silver (Ag) electrode and an amorphous silicon switching layer 104 can exhibit reverse response 206 following an initial program signal having a current limit of about 50 uA to about 80 uA.

Aspects of the present disclosure provide for pre-conditioning a memory cell to avoid the reverse response 206. Following initial fabrication of a two-terminal memory cell, one or more relatively low power signals can be applied to a memory cell as part of an initial forming event(s), resulting in a change in state (e.g., a program event) from the current-voltage response of $1^{st}$ state 202 to the current-voltage response of $2^{nd}$ state 204. Suitable low power signals can be achieved with a current limited signal, as one example. In response to the initial forming event achieved from relatively low power signal(s), the memory cell can be erased, returning to $1^{st}$ state 202 from $2^{nd}$ state 204, as depicted at FIG. 3, infra.

Figure 3:
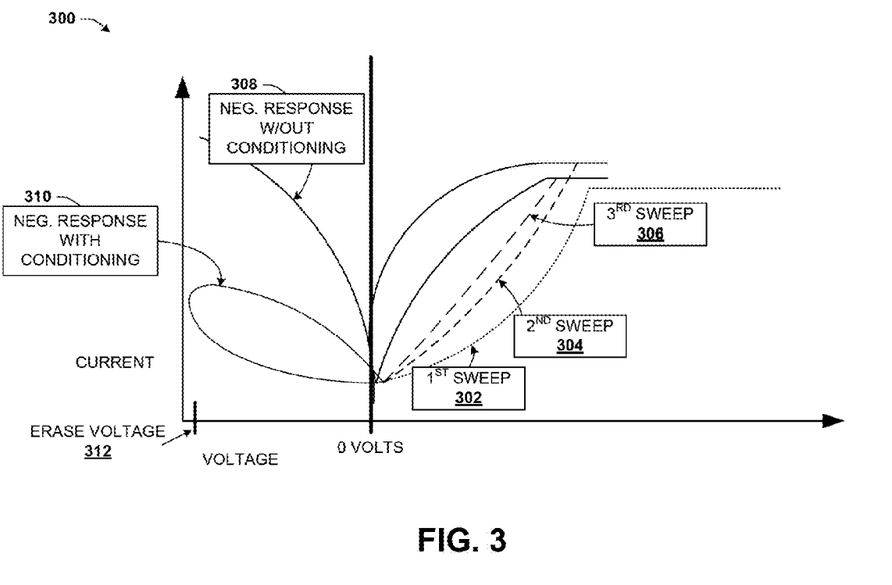
FIG. 3 depicts a diagram of a current voltage relationship for a two-terminal memory cell in response to preconditioning, in an embodiment(s)

FIG. 3 illustrates a diagram of an example chart 300 of current-voltage relationships of a two-terminal memory cell in response to disclosed pre-conditioning, according to one or more embodiments. The two-terminal memory cell can be memory cell 100 of FIG. 1, supra, in some embodiments. However, the subject disclosure is not limited to these embodiments.

Pre-conditioning is performed on a two-terminal memory cell in an as-formed condition. The as-formed condition refers to a memory cell that has been fabricated (e.g., as part of a memory array, a memory device comprising the memory array, as a standalone memory cell, or some other suitable implementation), but has not been subject to an initial forming event (e.g., a program signal).

Pre-conditioning can comprise a voltage sweep starting at about zero volts and increasing the voltage with a current limit. The voltage sweep can correspond with $1^{st}$ sweep 302 (dotted line), in some embodiments. This voltage sweep does not program the memory cell to a lower resistance state (e.g., $2^{nd}$ state 204 of FIG. 2, supra). Instead, $1^{st}$ sweep 302 follows a relatively slow increase in conducting current at the memory cell, in response to increasing voltage, for example as depicted by $1^{st}$ sweep 302. In various embodiments, $1^{st}$ sweep 302 can be implemented with a current limit less than about 20 uA. In some embodiments, the current limit for $1^{st}$ sweep 302 can be in a range between about 10 uA and about 20 uA, and in at least one embodiment the current limit for $1^{st}$ sweep 302 can be about 10 uA, less than 10 uA, or other suitable value. Ion penetration in response to $1^{st}$ sweep 302 can be relatively low: resulting about 1 nanoAmp (nA) at 1 volt (1 nA@1V), as one example. $1^{st}$ sweep 302 is ended by bringing voltage applied to the two-terminal memory cell back to about zero volts.

In some embodiments, pre-conditioning can include a $2^{nd}$ sweep 304 (short-dashed line) following $1^{st}$ sweep 302. $2^{nd}$ sweep 304 can comprise an increasing voltage with a higher current limit than the current limit utilized for $1^{st}$ sweep 302. As depicted by chart 300, $2^{nd}$ sweep 304 can exhibit a moderate increase in conduction current at the memory cell in response to the increasing voltage, as compared with the relatively low increase in conduction current for similar increasing voltage of $1^{st}$ sweep 302. The current limit for $2^{nd}$ sweep 304 can be between about 10 uA and about 20 uA in some embodiments; whereas in alternative or additional embodiments the current limit for $2^{nd}$ sweep 304 can be substantially 20 uA. In a resistive-switching memory cell, $1^{st}$ sweep 302 is theorized to induce migration of a small amount of ions within a resistive switching layer of the memory cell, leading to the relatively small conductive current response associated with $1^{st}$ sweep 302. The $2^{nd}$ sweep 304 at the higher current limit is theorized to induce a larger ion migration within the resistive switching layer, possibly through a greater extent of the resistive switching layer, resulting in the higher conductive current response associated with $2^{nd}$ sweep 304.

In one or more embodiments, pre-conditioning can include one or more additional voltage sweeps, such as $3^{rd}$ sweep 306 (long-dashed line). $3^{rd}$ sweep 306 can comprise a higher current limit than $2^{nd}$ sweep 304, such as between about 20 uA and about 30 uA, and result in even higher conductive current at the memory cell. $3^{rd}$ sweep 306 can conclude by returning the voltage back to about zero volts. Upon completing pre-conditioning, the memory cell can be programmed with higher current compliance, e.g., about 50 uA to about 80 uA, or other suitable current compliance, achieving a higher ion penetration (e.g., 100 nA-1 uA@1V). Whereas without the pre-conditioning, the inventors anticipate a memory cell exhibiting a negative response 308 in which erasing the memory cell can be difficult or ineffective, with the pre-conditioning a negative response 310 that is readily erasable at a suitable erase voltage 312 can be achieved instead.

According to various embodiments, a negative bias can be applied to the memory cell following the last voltage sweep associated with pre-conditioning, and before programming the memory cell with higher current compliance. In alternative embodiments, a negative bias can be applied to the memory cell following respective ones of the voltage sweeps associated with pre-conditioning. These embodiments are described below.

The aforementioned diagrams have been described with respect to several components (e.g., layers) of a memory cell, or memory operations associated with such memory cells. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer or contact layer there between. Additionally, it is noted that one or more disclosed processes can be combined into a single process providing aggregate functionality. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIG. 4-7. While for purposes of simplicity of explanation, the methods of FIGS. 4-7 are shown and described as respective series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the respective methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium. In addition, such an article of manufacture can include a compact Flash memory card, a universal serial bus memory card, a secure digital card or the like (e.g., mini SD, micro SD, etc.), or other suitable article of manufacture facilitating storage of digital information or portable storage of digital information.

Figure 4:
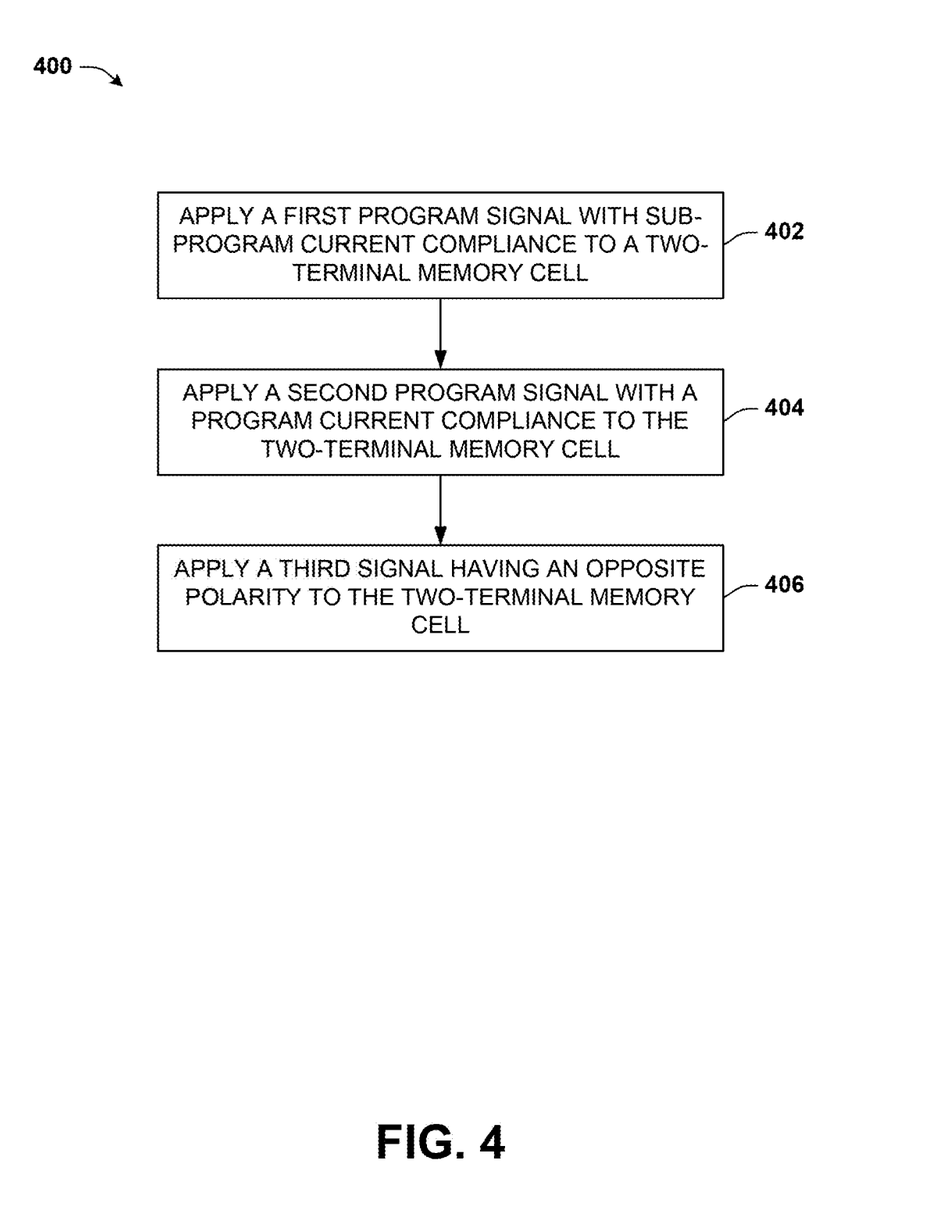
FIG. 4 illustrates a flowchart of a sample method for pre-conditioning a two-terminal memory cell in one or more embodiments.

FIG. 4 illustrates a flowchart of an example method 400 according to additional embodiments of the present disclosure. Method 400 can facilitate providing pre-conditioning for two-terminal memory, to enhance endurance and improve reliability of switching performance of a multi-programmable memory. In at least one embodiment, method 400 can be employed on conjunction with a resistive-switching memory (e.g., a resistive random access memory, a resistive memory, and so forth). In at least one disclosed aspect of the present disclosure, the resistive-switching memory can have a first electrode that facilitates generation of conductive ions within a switching medium of the resistive-switching memory, in response to an electric signal. In alternative disclosed aspects, the first electrode can comprise a conductive wire (e.g., an atomic metal, an ionically bonded metal compound, or the like) of a memory device suitable to generate conductive ions at a boundary of the conductive wire and a switching medium of the two-terminal memory. Other alternatives known in the art or made known to one of ordinary skill in the art by way of the context provided herein are considered within the scope of the present disclose.

At 402, method 400 can comprise applying a first program signal to a first electrode of a two-terminal memory cell. The first program signal can have a first current limit. As one example, the first current limit can have a magnitude lower than a minimum program current associated with switching the two-terminal memory cell to a program state. Additionally, at 404, method 400 can comprise applying a second program signal to the first electrode of the two-terminal memory cell. For instance, the second program signal can have a second current limit, where the second current limit is larger in magnitude than the first current limit. As one example, the second current limit can be about 20 uA, and the first current limit can be about 10 uA, although the subject disclosure is not so limited. At 406, method 400 can comprise applying a third signal to the first electrode of the two-terminal memory cell, wherein the third signal has a polarity that is opposite to the first program signal or the second program signal. Following the pre-conditioning provided by method 400, the two-terminal memory cell can be programmed with a program signal of relatively high current compliance, and erased with a signal of opposite polarity from the program signal.

Figure 5:
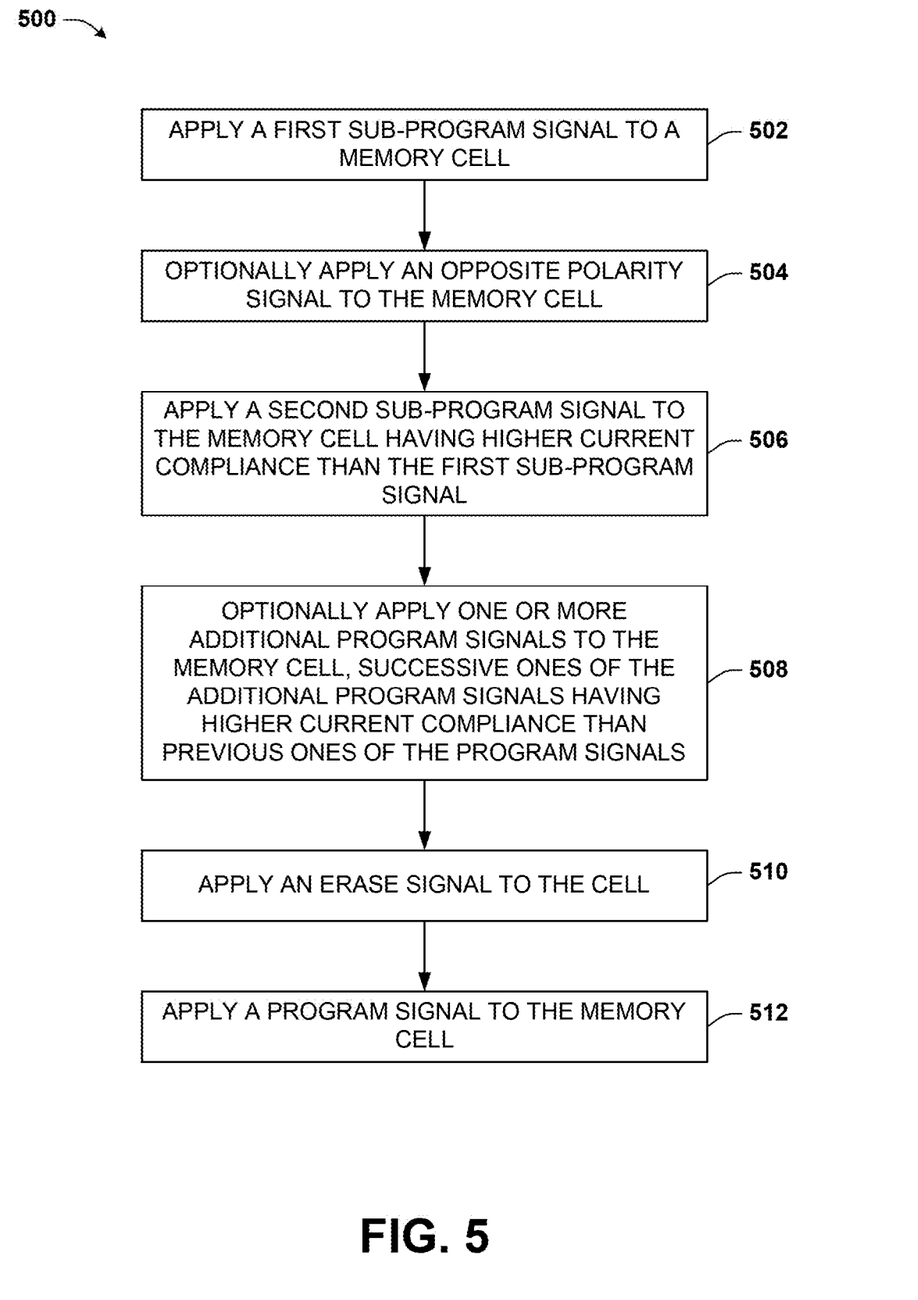
FIG. 5 depicts a flowchart of an example method for pre-conditioning a two-terminal memory cell in other embodiments.

FIG. 5 illustrates a flowchart of a sample method 500 for providing preconditioning of two-terminal memory according to additional embodiments of the subject disclosure. At 502, method 500 can comprise applying a first sub-program signal to a memory cell. The first sub-program signal can promote ion penetration within a switching layer of the memory cell, for instance, but has an insufficient amount of power (e.g., current compliance) to cause the memory cell to experience a state transition. At 504, method 500 can comprise optionally applying an opposite-polarity signal to the memory cell. The opposite-polarity signal can oppose, at least in part, the ion promotion promoted by the first sub-program signal. At 506, method 500 can comprise applying a second sub-program signal to the memory cell. The second sub-program signal can have higher power than the first sub-program signal. In some embodiments, the sub-program signal can also be of a power that is insufficient to cause the memory cell to experience the state transition. At 508, method 800 can optionally apply one or more additional program signals to the memory cell. In some disclosed embodiments, respective ones of the one or more additional program signals (where applicable) can have higher power than previous program signals of method 500 (including, e.g., first sub-program signal and second sub-program signal). At 510, method 500 can comprise applying an erase signal to the memory cell. At 512, method 500 can comprise applying a program signal to the memory cell, causing the memory cell to experience the state change. In some embodiments, the program signal can have a high current compliance; e.g., the program signal can have a range of current compliance between about 50 uA and about 80 uA.

Figure 6:
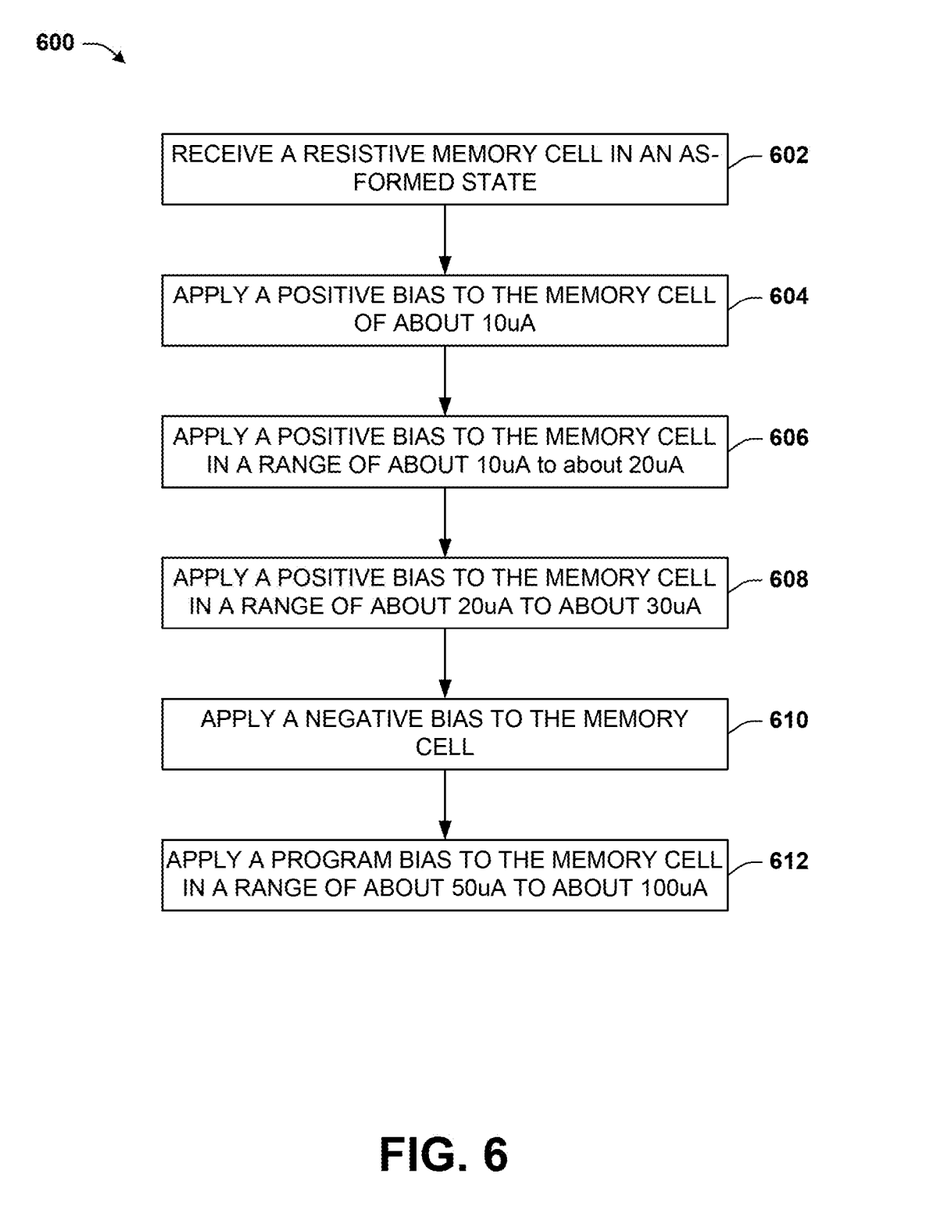
FIG. 6 illustrates a flowchart of a sample method for pre-conditioning a two-terminal memory cell in an additional embodiment.

FIG. 6 illustrates a flowchart of a sample method 600 according to alternative or additional embodiments of the subject disclosure. At 602, method 600 can comprise receiving a resistive memory cell in an as-formed state. The as-formed state can be post-fabrication, but prior to application of an external driven electric signal at the resistive memory cell. At 604, method 600 can comprise applying a positive bias to the resistive memory cell with a current compliance of about 10 uA. The positive bias can be terminated following a suitable application period, pulse width, or the like. At 606, method 600 can comprise applying a second positive bias to the resistive memory cell, the second positive bias having a current compliance in a range between about 10 uA and about 20 uA. The second positive bias can be terminated following a suitable application period/pulse width. At 608, method 600 can comprise applying a third positive bias to the resistive memory cell in a range of about 20 uA to about 30 uA. The third positive bias can be terminated following a suitable application period/pulse width. At 610, a negative bias can be applied to the resistive memory cell. The negative bias can have a magnitude associated with a suitable erase signal for the resistive memory cell. At 612, method 600 can comprise applying a program bias to the resistive memory cell having a current compliance within a range between about 50 uA and about 100 uA, or another suitable current compliance for programming the resistive memory cell.

Figure 7:
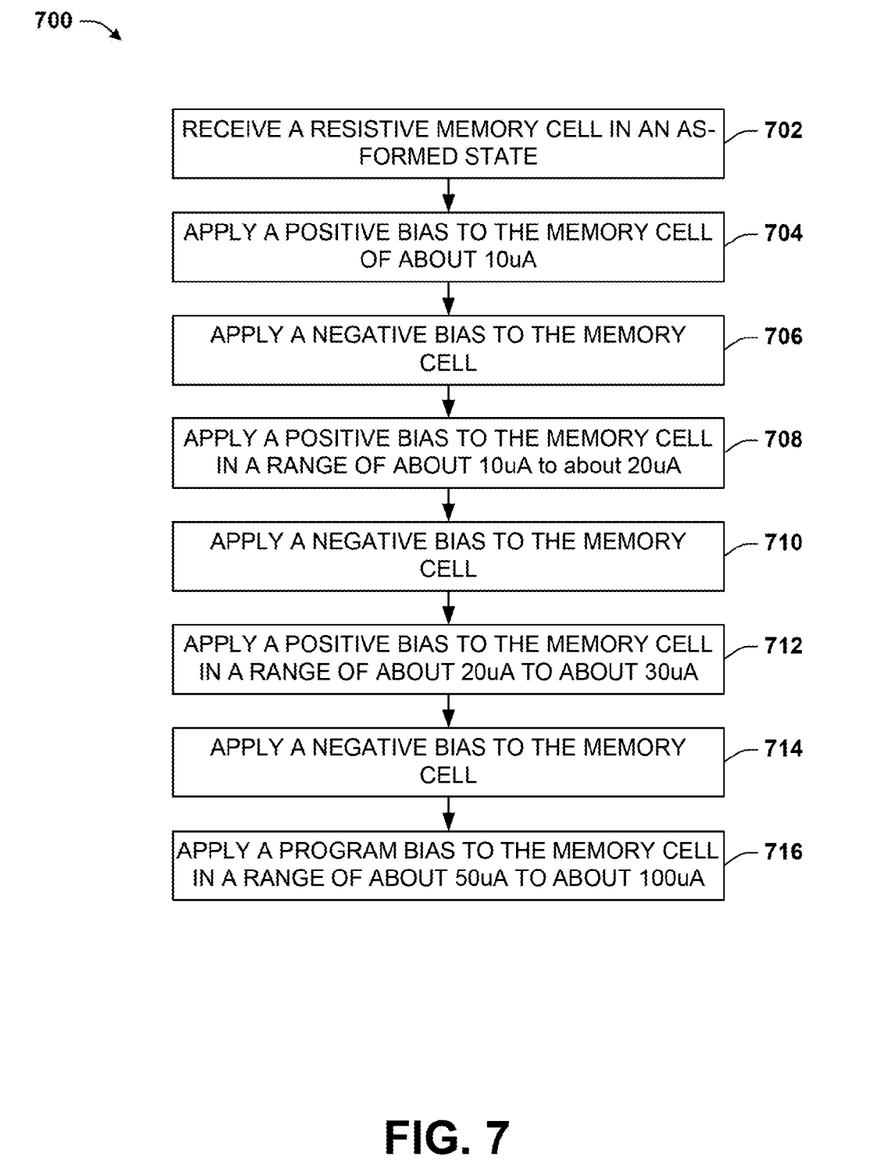
FIG. 7 depicts a flowchart of an example method for pre-conditioning a two-terminal memory cell according to an alternative or additional embodiment.

FIG. 7 depicts a flowchart of an example method 700 for providing preconditioning of a resistive memory cell according to alternative embodiments of the disclosure. At 702, method 700 can comprise receiving a resistive memory cell in an as-formed state (e.g., post-fabrication, and prior to application of a driven voltage sweep). At 704, method 700 can comprise applying a positive bias to the resistive memory cell of about 10 uA. At 706, method 700 can comprise applying a negative bias to the resistive memory cell. At 708, method 700 can comprise applying a second positive bias to the resistive memory cell, the second positive bias having a current compliance in a range of about 10 uA and about 20 uA. At 710, method 700 can comprise applying the negative bias to the resistive memory cell (of same or differing magnitude than the negative bias of reference number 706, above). At 712, method 700 can comprise applying a third positive bias to the resistive memory cell, the third positive bias having a current compliance in a range of about 20 uA and about 30 uA. At 714, method 700 can comprise applying the negative bias to the resistive memory cell. At 716, method 700 can comprise applying a program bias to the resistive memory cell with a current compliance in a range of about 50 uA and about 100 uA.

In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 8 and 9, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Two-terminal memory, such as resistive-switching memory, can alleviate many problems observed by NAND FLASH at or below 25 nm technology. Aspects of the subject disclosure provide for improved endurance and reliable switching operation for such two-terminal memory, mitigating or avoiding problems associated with increased current in response to application of a negative voltage to a programmed memory cell, also referred to as "reverse pop".

Figure 8:
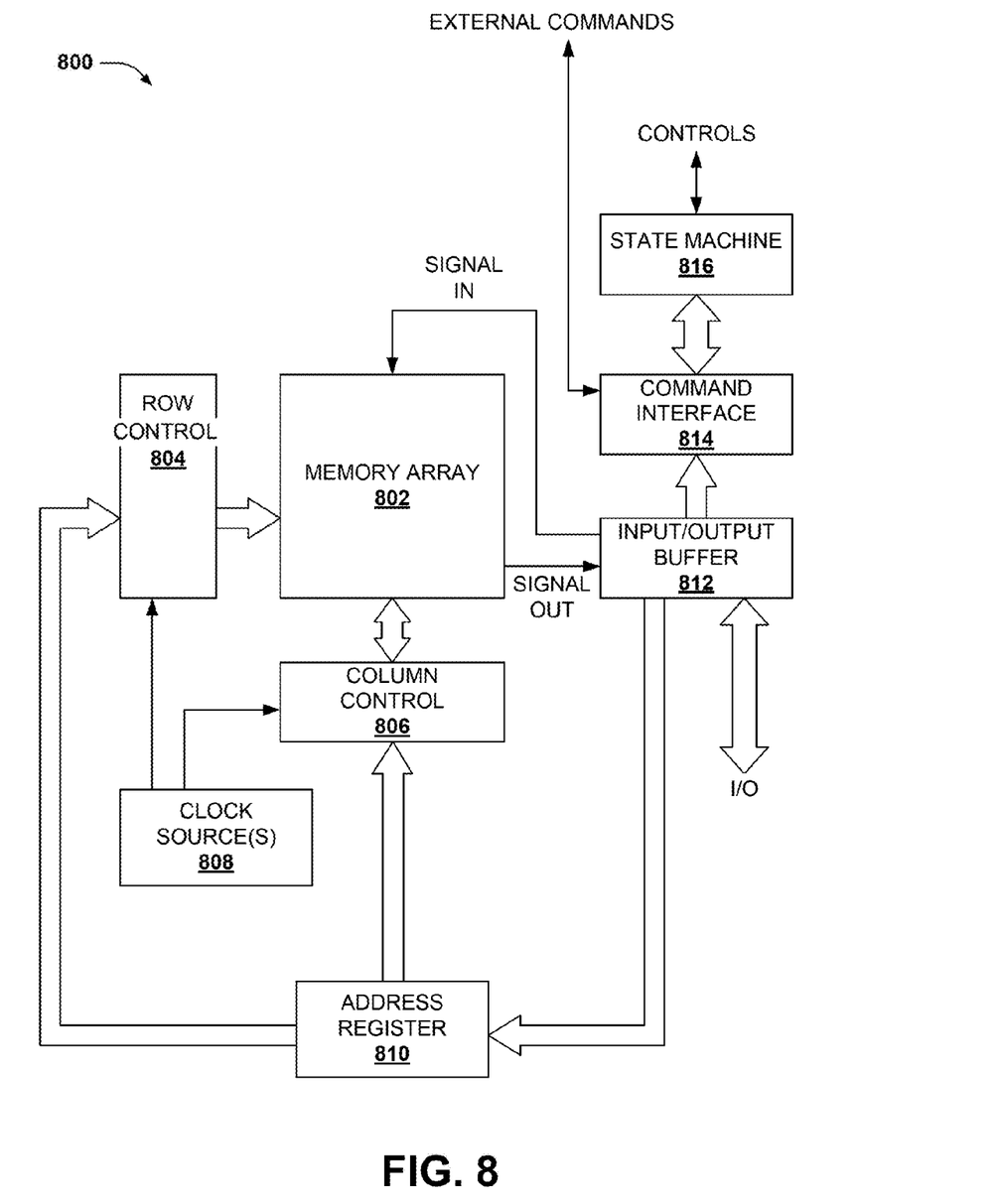
FIG. 8 illustrates a block diagram of a sample operating and control environment for a memory device according to various disclosed embodiments.

In order to provide a context for the various aspects of the disclosed subject matter, FIG. 8, as well as the following discussion, is intended to provide a brief, general description of a suitable environment in which various aspects of the disclosed subject matter can be implemented or processed. While the subject matter has been described above in the general context of two-terminal memory and process methodologies for fabricating or operating such memory, those skilled in the art will recognize that the subject disclosure also can be implemented in combination with other memory cells, arrays of memory cells or process methodologies. Moreover, those skilled in the art will appreciate that the disclosed processes can be practiced with a processing system or a computer processor, either alone or in conjunction with a host computer (e.g., computer 902 of FIG. 9, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 8 illustrates a block diagram of an example operating and control environment 800 for a memory cell array 802 according to aspects of the subject disclosure. In at least one aspect of the subject disclosure, memory cell array 802 can comprise a variety of memory cell memory cell technology. Particularly, memory cell array can comprise resistive switching memory cells with pre-conditioning, as described herein.

A column controller 806 can be formed adjacent to memory cell array 802. Moreover, column controller 806 can be electrically coupled with bit lines of memory cell array 802. Column controller 806 can control respective bitlines, applying suitable program, erase or read voltages to selected bitlines.

In addition, operating and control environment 800 can comprise a row controller 804. Row controller 804 can be formed adjacent to column controller 806, and electrically connected with word lines of memory cell array 802. Row controller 804 can select particular rows of memory cells with a suitable selection voltage. Moreover, row controller 804 can facilitate program, erase or read operations by applying suitable voltages at selected word lines.

A clock source(s) 808 can provide respective clock pulses to facilitate timing for read, write, and program operations of row controller 804 and column controller 806. Clock source(s) 808 can further facilitate selection of word lines or bit lines in response to external or internal commands received by operating and control environment 800. An input/output buffer 812 can be connected to an external host apparatus, such as a computer or other processing device (not depicted, but see e.g., computer 902 of FIG. 9, infra) by way of an I/O buffer or other I/O communication interface. Input/output buffer 812 can be configured to receive write data, receive an erase instruction, output readout data, and receive address data and command data, as well as address data for respective instructions. Address data can be transferred to row controller 804 and column controller 806 by an address register 810. In addition, input data is transmitted to memory cell array 802 via signal input lines, and output data is received from memory cell array 802 via signal output lines. Input data can be received from the host apparatus, and output data can be delivered to the host apparatus via the I/O buffer.

Commands received from the host apparatus can be provided to a command interface 814. Command interface 814 can be configured to receive external control signals from the host apparatus, and determine whether data input to the input/output buffer 812 is write data, a command, or an address. Input commands can be transferred to a state machine 816.

State machine 816 can be configured to manage programming and reprogramming of memory cell array 802. State machine 816 receives commands from the host apparatus via input/output buffer 812 and command interface 814, and manages read, write, erase, data input, data output, and similar functionality associated with memory cell array 802. In some aspects, state machine 816 can send and receive acknowledgments and negative acknowledgments regarding successful receipt or execution of various commands.

To implement read, write, erase, input, output, etc., functionality, state machine 816 can control clock source(s) 808. Control of clock source(s) 808 can cause output pulses configured to facilitate row controller 804 and column controller 806 implementing the particular functionality. Output pulses can be transferred to selected bit lines by column controller 806, for instance, or word lines by row controller 804, for instance.

In connection with FIG. 9, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 9:
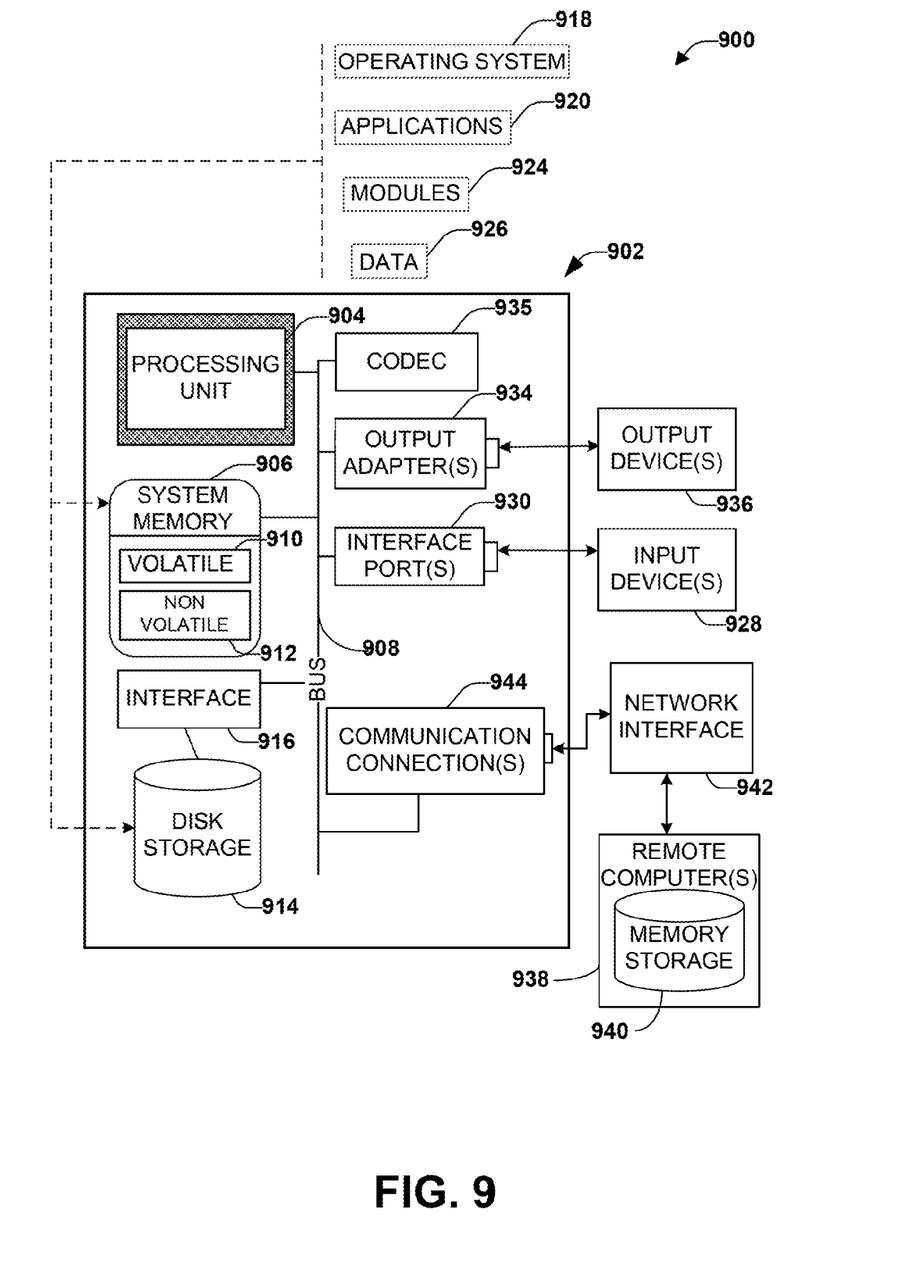
FIG. 9 depicts a block diagram of an example computing environment that can be implemented in conjunction with various embodiments.

With reference to FIG. 9, a suitable operating environment 900 for implementing various aspects of the claimed subject matter includes a computer 902. The computer 902 includes a processing unit 904, a system memory 906, a codec 935, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 906 includes volatile memory 910 and non-volatile memory 912, which can employ one or more of the disclosed memory architectures, memory cells, memory processes, or the like, in various embodiments. The basic input/output system (BIOS), containing the basic routines to transfer information between elements within the computer 902, such as during start-up, is stored in non-volatile memory 912. In addition, according to present innovations, codec 935 may include at least one of an encoder or decoder, wherein the at least one of an encoder or decoder may consist of hardware, software, or a combination of hardware and software. Although, codec 935 is depicted as a separate component, codec 935 may be contained within non-volatile memory 912. By way of illustration, and not limitation, non-volatile memory 912 can include read only memory (ROM), programmable ROM (PROM), electrically programmable ROM (EPROM), electrically erasable programmable ROM (EEPROM), or Flash memory. Non-volatile memory 912 can employ one or more of the disclosed memory architectures, in at least some disclosed embodiments. Moreover, non-volatile memory 912 can be computer memory (e.g., physically integrated with computer 902 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 910 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 902 may also include removable/non-removable, volatile/non-volatile computer storage medium. FIG. 9 illustrates, for example, disk storage 914. Disk storage 914 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 914 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 914 to the system bus 908, a removable or non-removable interface is typically used, such as interface 916. It is appreciated that disk storage 914 can store information related to a user. Such information might be stored at or provided to a server or to an application running on a user device. In one embodiment, the user can be notified (e.g., by way of output device(s) 936) of the types of information that are stored to disk storage 914 and/or transmitted to the server or application. The user can be provided the opportunity to opt-in or opt-out of having such information collected and/or shared with the server or application (e.g., by way of input from input device(s) 928).

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices, such as monitors, speakers, and printers, among other output devices, which require special adapters. The output adapter 934 can include, by way of illustration and not limitation, video and sound cards that provide a means of connection between the output device 936 and the system bus 908. It should be noted that other devices and/or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 944 refers to the hardware/software employed to connect the network interface 942 to the system bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments.

In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for a memory device, comprising:
applying a first program signal to a first electrode of a two-terminal memory cell, the first program signal having a first current limit;
applying a second program signal to the first electrode of the two-terminal memory cell, the second program signal having a second current limit; and
applying a third signal to the first electrode of the two-terminal memory cell, the third signal having a polarity opposite to the first program signal or the second program signal, wherein:
the second current limit is larger in magnitude than the first current limit, and the first current limit has a magnitude lower than a minimum program current associated with switching the two-terminal memory cell to a program state.

2. The method of claim 1, wherein the two-terminal memory cell is in a post-fabrication condition free from positive voltage applied at the first electrode prior to the applying the first program signal, the second program signal or the third signal.

3. The method of claim 1, further comprising applying an erase signal to the two-terminal memory cell in response to applying the first program signal, the erase signal having the polarity opposite to the first program signal.

4. The method of claim 3, further comprising employing the erase signal for the third signal.

5. The method of claim 1, further comprising applying one or more additional program signals in response to applying the second program signal and before applying the third signal.

6. The method of claim 5, further comprising providing at least a third current limit for the one or more additional program signals, the third current limit having a current magnitude higher than the second current limit.

7. The method of claim 1, further comprising employing differing voltages for the first program signal and the second program signal.

8. The method of claim 1, further comprising providing a current limit of about 10 microamperes ($\mu A$) or less for the first current limit.

9. The method of claim 1, further comprising providing a current limit within a range of about 50 $\mu A$ to about 100 $\mu A$ for the second current limit.

10. The method of claim 1, wherein the first program signal is configured to cause the two-terminal memory cell to have a current response of about 1 nanoamps (nA) in response to application of about 1 volt at the first electrode.

11. The method of claim 1, wherein the second program signal is configured to cause the two-terminal memory cell to have a current response between about 100 nA and about 1 microAmp ($\mu A$) in response to application of about 1 volt at the first electrode.

12. The method of claim 1, further comprising:
applying a first erase pulse to the first electrode in response to applying the first program signal, the first erase pulse having the opposite polarity;
applying a second erase pulse to the first electrode in response to applying the second program signal, the second erase pulse having the opposite polarity; and
applying one or more combinations of an additional program signal followed by an associated erase signal, wherein the additional program signal has an equal or higher current compliance than a most recent program signal applied to the first electrode.

13. A method of preconditioning a resistive switching memory cell in advance of utilization of the resistive switching memory cell in a memory operation, comprising:
applying a first voltage across a resistive switching memory cell, the first voltage selected to cause the resistive switching memory cell to have a current response lower than a program state current response;
applying a second voltage across the resistive switching memory cell, the second voltage selected to cause the resistive switching memory cell to have a second current response greater than the current response; and
applying an erase voltage to the resistive switching memory cell.

14. The method of claim 13, the erase voltage being applied to the resistive switching memory cell in response to applying the first voltage, or in response to applying the second voltage.

15. The method of claim 13, wherein the second current response is less than the program state current response.

16. The method of claim 13, wherein at least one of:
the first voltage is associated with a current compliance of about 10 nA; or
the second voltage is associated with a current compliance of about 20 nA or greater.

17. The method of claim 13, wherein at least one of:
the current response is about 1 nA per volt; or
the second current response is between about 100 nA per volt and about 1 µA per volt.

18. An electronic device, comprising:
a memory comprising a substrate having a complementary semiconductor metal oxide (CMOS) device and a two-terminal memory cell, both formed on or above the substrate, wherein the memory is configured to store instructions related to operating the electronic device;
a memory controller configured to operate the memory; and
a processor communicatively connected to the memory and configured to execute the instructions to facilitate operations of the electronic device, wherein the two-terminal memory cell is preconditioned, the preconditioning comprising:
applying a first signal having a first current compliance to the two-terminal memory cell; and
applying a second signal to the two-terminal memory cell having a second current compliance to the two-terminal memory cell, the second current compliance having higher magnitude than the first current compliance.

19. The electronic device of claim 18, wherein the first signal comprises an electric field magnitude lower than a program magnitude associated with causing a resistive state change for the two-terminal memory cell to a low resistance state.

20. The electronic device of claim 18, further comprising applying a first erase signal in response to the first signal, and a second erase signal in response to the second signal, wherein the first erase signal and the second erase signal have a polarity opposite the first signal and the second signal.

* * * * *